United States Patent [19]

Block et al.

[11] Patent Number: 5,329,428
[45] Date of Patent: Jul. 12, 1994

[54] HIGH-DENSITY PACKAGING FOR MULTIPLE REMOVABLE ELECTRONICS SUBASSEMBLIES

[75] Inventors: Timothy R. Block; David P. Gaio; Ronald L. Soderstrom, all of Rochester, Minn.

[73] Assignee: International Business Machines Corporation, Armonk, N.Y.

[21] Appl. No.: 80,275

[22] Filed: Jun. 21, 1993

[51] Int. Cl.⁵ .......................................... H01R 23/68
[52] U.S. Cl. ...................................... 361/785; 439/46; 439/47; 439/74; 439/75
[58] Field of Search ............... 361/760, 761, 784, 785, 361/792; 174/260; 439/44, 45, 46, 47, 48, 65, 74, 75

[56] References Cited

U.S. PATENT DOCUMENTS 4,969,066 11/1990 Eibl et al. ............................. 361/785
5,113,317 5/1992 Holle .................................... 361/785

Primary Examiner—Leo P. Picard
Assistant Examiner—Bot Ledynh
Attorney, Agent, or Firm—J. Michael Anglin

[57] ABSTRACT

Packaging for an electronics assembly. A base card has a row of elongated slots. A number of individually insertable subassemblies have standoff feet and a pair of offset hooks at their sides. The hooks snap into the slots in such a way that each slot can hold the hooks for four different subassemblies, which are positioned adjacent each other and on both sides of the base card.

12 Claims, 3 Drawing Sheets

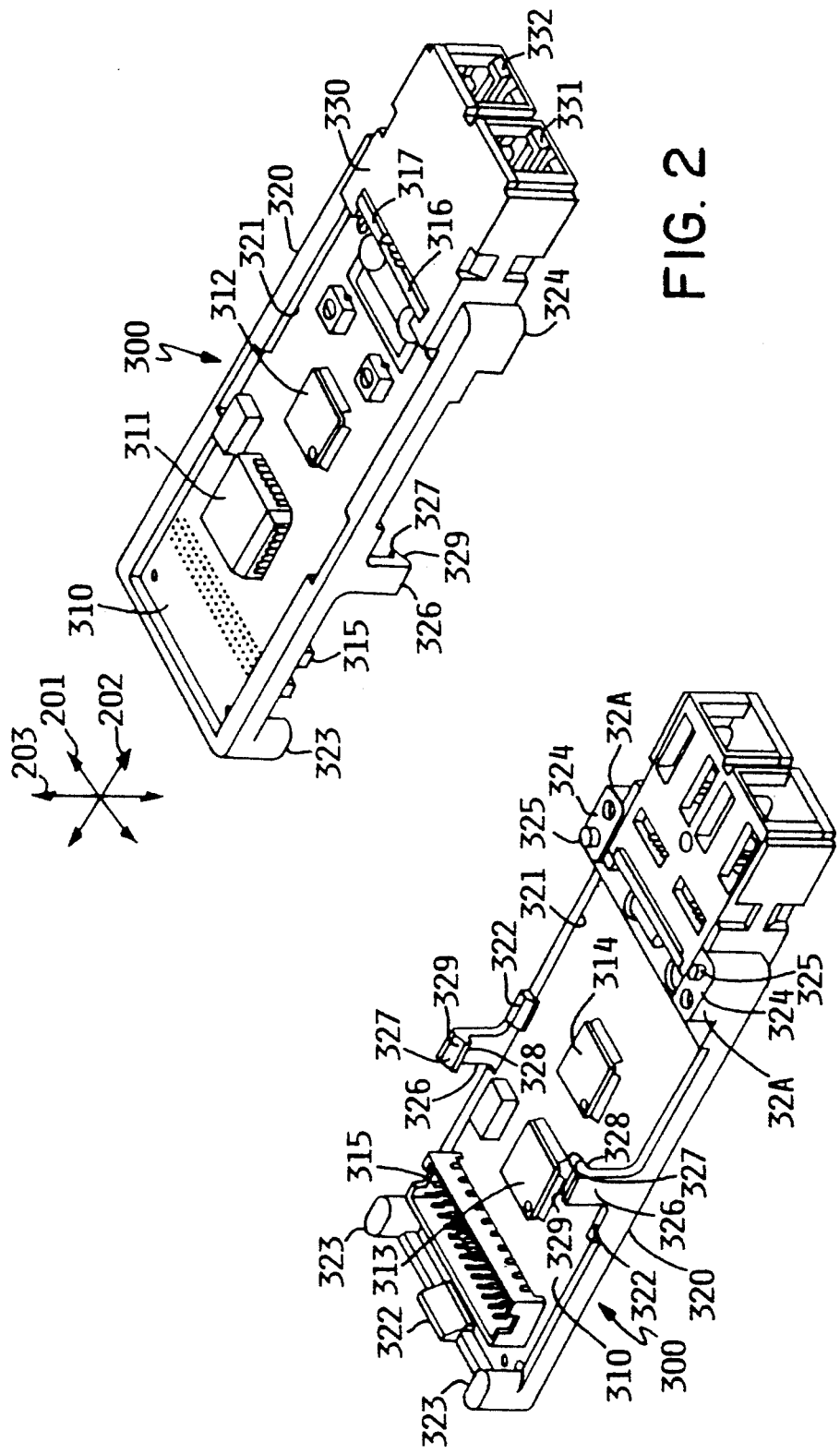

HIGH-DENSITY PACKAGING FOR MULTIPLE REMOVABLE ELECTRONICS SUBASSEMBLIES

BACKGROUND OF THE INVENTION

The present invention relates to the physical packaging of electronic circuits and similar items, and more particularly concerns a system for mounting multiple subassemblies at high density on a single base card.

Electronic and optoelectronic circuits seem to decrease in physical size almost without limit. This usually does not result in a decrease in the size of the overall system, but rather the inclusion of ever increasing numbers of circuits within a single system. In many systems, such as switching systems, communications systems, and the like, the demand is to package larger numbers of a common subassembly within the same frame. For example, a system for interconnecting multiple optical fibers may require dozens of "link cards" which each convert a serial optical signal at gigabit frequencies into a parallel electrical signal and vice versa. In such systems, the high signal frequencies also make small physical size and dense packaging very desirable.

Previous advances in electronics packaging at the card or subassembly level have required large spacing between adjacent subassemblies for insertion and removal, have been difficult to insert and remove, have been fragile or expensive, or have interfered with heat dissipation from the system.

SUMMARY OF THE INVENTION

The present invention focuses upon increasing packaging density by decreasing the allowable spacing between subassemblies mounted on a common base card, while preserving ease of inserting and removing the individual subassemblies; in fact, no tools are required for either insertion or removal. The packaging is inexpensive, rugged, easily manufactured, simple to operate, and does not interfere with heat dissipation, the other major problem of high packaging density.

In a system or overall assembly according to the invention, a base card has a row of elongated slots. A number of individually insertable subassemblies have standoff feet and a pair of offset hooks at their sides. The hooks snap into the slots in such a way that each slot can hold the hooks for four different subassemblies, which are positioned adjacent each other and on both sides of the base card.

DESCRIPTION OF THE DRAWING

FIG. 2 is a perspective view of the top of a subassembly shown in FIG. 1.

FIG. 3 is a perspective view of the bottom of the subassembly shown in FIG. 2.

DESCRIPTION OF A PREFERRED EMBODIMENT

Figure 1:
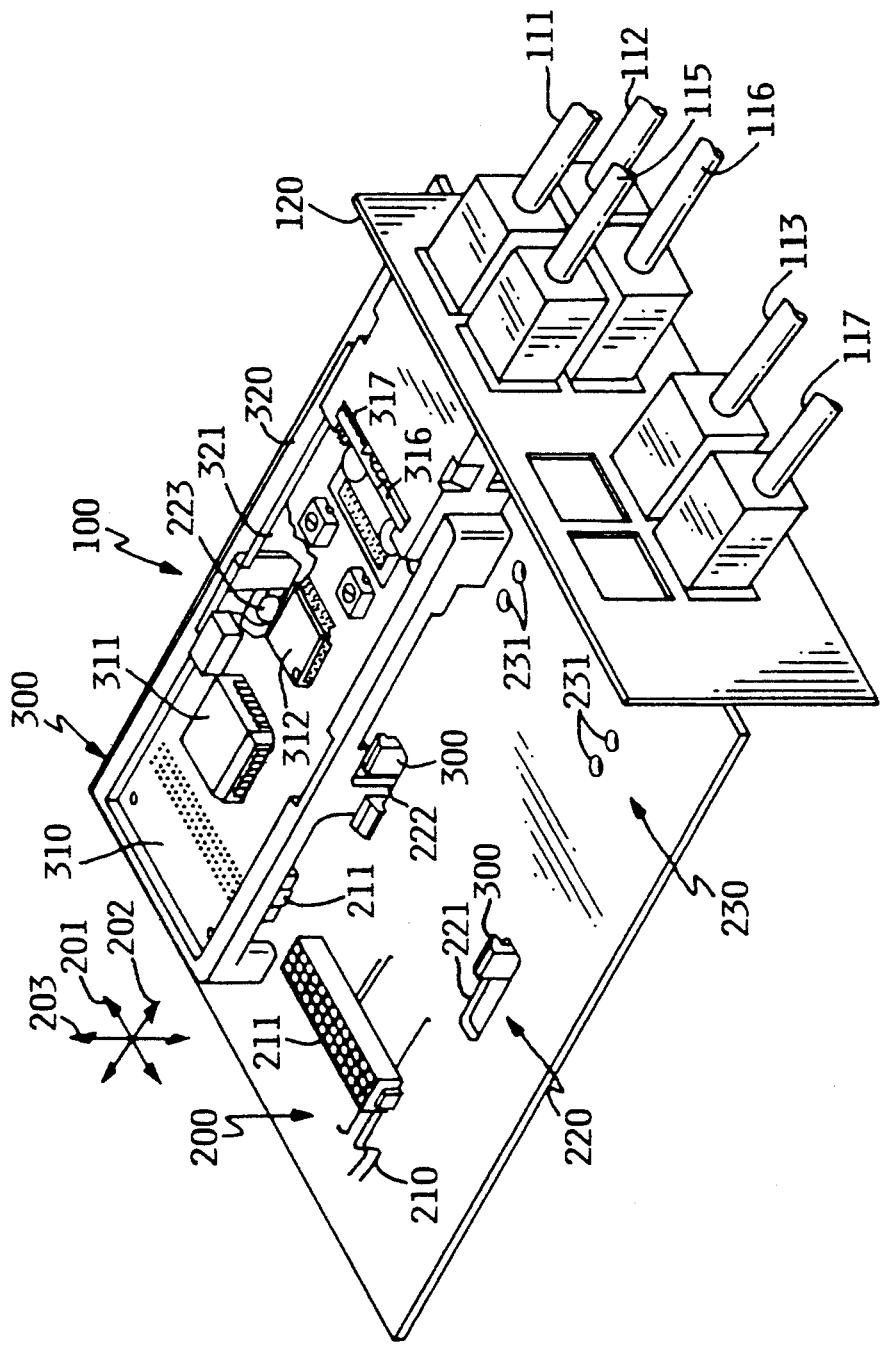
FIG. 1 is a perspective view of a base card and a number of subassemblies according to the invention.

FIG. 1 shows a portion of an electronics system 100 whose overall function may be, for example, to interconnect incoming signals from a large number of fiber-optic cables, a few of which are shown at 111–113, selectively to multiple outgoing signals on other fiber-optic cables, such as 115–117. Panel 120, through which the cables are connected, may be a part of an overall enclosure for the system.

System 100 includes one or more base cards 200 each carrying multiple removable subassemblies 300. Base card 200 is positioned in a plane indicated by direction arrows 201 and 202. FIG. 1 shows only a portion of a base card; a full base card may extend much farther in the direction of arrows 201 and 202. Also, additional base cards, not shown, may be stacked in parallel planes atop card 200, in the direction of arrows 203. Base card 200 may be attached directly to panel 120, or may be attached to some other frame or similar means not shown.

Base card 200 is a printed circuit card of conventional design, and carries wiring, a small portion of which is indicated at 210, in surface and/or internal planes. Connectors 211 are coupled to the wiring to distribute electrical signals and power, both among the connectors and to and from other components, not shown.

Base card 200 has a row 220 of elongated obround slots 221–223 cut through the card. (A portion of subassembly 300 has been cut away in FIG. 1 to reveal the location of slot 223.) Row 220 extends in the direction of arrows 201, but the long axis of each slot extends in the direction of arrows 202, perpendicular to the direction of the row. In addition, card 200 contains a row 230 including locating holes 231, as well as additional holes not visible in FIG. 1. Row 230 is parallel to row 220.

A number of subassemblies 300 are individually removably mounted on base card 200. FIGS. 2 and 3 show top and bottom views of one of these subassemblies.

Printed-circuit subassembly card 310 carries electronics components such as 311–314, which may be attached by surface-mount technology (SMT) or other conventional means. In this example, these components form circuits for converting parallel electrical signals to and from serial signals for transmission in optical fibers. Conventional connector 315 mates with connector 211 to transfer the parallel signals via wiring 210, FIG. 1.

A molded plastic card retainer or frame 320 contains a lip 321 and tabs 322 for engaging and holding three sides of card 310; the card may be inserted into the frame during manufacture of the subassembly 300 merely by pushing it upward past the tabs until it locks into place under the lip. The fourth edge of the card carries optical components, a laser 317 and a photodetector 316, for converting the serial electrical signals to and from optical signals on cables such as 111 and 115. Sockets 331 and 332 for the cables are a one-piece mold which surrounds the optical components, and snaps into housing 330. Housing 330 is preferably molded in a single piece with frame 320, although these could be separate if desired.

Frame 320 has four feet or standoffs projecting in the direction of arrows 203, perpendicularly downward from the plane defined by frame 320 and card 310, at each corner of circuit card 310. Rear feet 323 have flat surfaces, but front feet 324 have short molded pins 325. The long sides of frame 320 have integrally molded hooks 326. Each hook has a barb 327 with an undersurface 328 and a sloped camming surface 329. As may be seen in FIG. 3, hooks 326 are not directly across from each other on frame 320. Rather, one hook is set forward, toward housing 330, while the other is set back, farther away from the housing. This offset between the two hooks equals or slightly exceeds the width of the hooks in the direction of arrows 202. Hooks 326 are sufficiently long (direction 203) and thin (in direction 201) that they are somewhat flexible yet resilient.

FIG. 1 shows how multiple subassemblies 300 are mounted on a single base card 200. The subassembly at the upper right of FIG. 1 is pushed downward so that barbs 327 of hooks 326 pass through slots 222 and 223, pins 325 seat in the appropriate holes 231, and connector 315 mates with connector 211. The spacing of hooks 326 from each other is substantially equal to the spacing between slots, so that camming surfaces 329 engage the sides of the slots. The resilience of the hooks 326 pushes them apart and through the slots as further downward pressure is applied to the subassembly frame. The relative height of feet 323 and 324, and the length of hooks 326 are preferably such that a slight flexure of frame 320 is required before barbs 327 pass completely through their respective slots so that undersurfaces 328 engage the opposite side of the base card. At that point, releasing downward pressure on the frame causes it to spring back, and to pull undersurfaces into firm engagement with the base card adjacent slots 222 and 223. Preferably, undersurfaces 328 are slightly bevelled so that the subassembly is retained on base card 200, yet a moderate upward pressure applied to the subassembly frame will cam them apart and allow the subassembly to be removed from the base card 200; bevel angles of ten to thirty degrees have been found to give an acceptable range of tensions.

In applications where more permanent mounting is desired, additional holes 32A in frame 320 allow self-tapping screws to be inserted through some of the holes 231 in base card 310.

Slots 221-223 are made slightly longer than twice the width of a hook 326, and slightly wider than twice the thickness of a hook. Thus the hooks 326 on the upper right subassembly engage the forward left quarter of slot 223 and the rear right quarter of slot 222. This allows another subassembly of exactly the same construction (only whose hooks are shown in FIG. 1) to be mounted directly under the upper right subassembly, also in slots 222 and 223. The hooks of this lower right subassembly then occupy the forward right quarter of slot 222 and the rear left quarter of slot 223, because this subassembly is upside down with respect to the upper right subassembly. A third subassembly (again, only its hooks are shown) can be mounted in slots 221 and 222, as shown at the lower left of FIG. 1. The hooks of this subassembly occupy the rear left quarter of slot 222 and the forward right quarter of slot 221. Yet a fourth card, omitted entirely from FIG. 1 for clarity, may then be pushed downward at the upper left of FIG. 1, so that its hooks engage the forward left quarter of slot 222 and the rear right quarter of slot 221.

At this point in the assembly, the single slot 222 engages the hooks from four different subassemblies. Extending base card 200 in the direction of arrows 201 allows additional subassemblies to be mounted in very close proximity to each other, by filling more of the slots with four hooks. Stacking additional base cards (not shown) would allow even more subassemblies to fit compactly within a single overall unit. For example, one version of subassembly 300 measures 102.6 mm long, 35.25 mm wide, and 11.85 mm high. The present invention allows four subassemblies to contained within a volume of 102.6 mm by 72.1 mm by 25.0 mm. That is, the spacing between subassemblies is only 1.58 mm in width and 1.35 mm (the thickness of the base card) in height.

Figure 4:
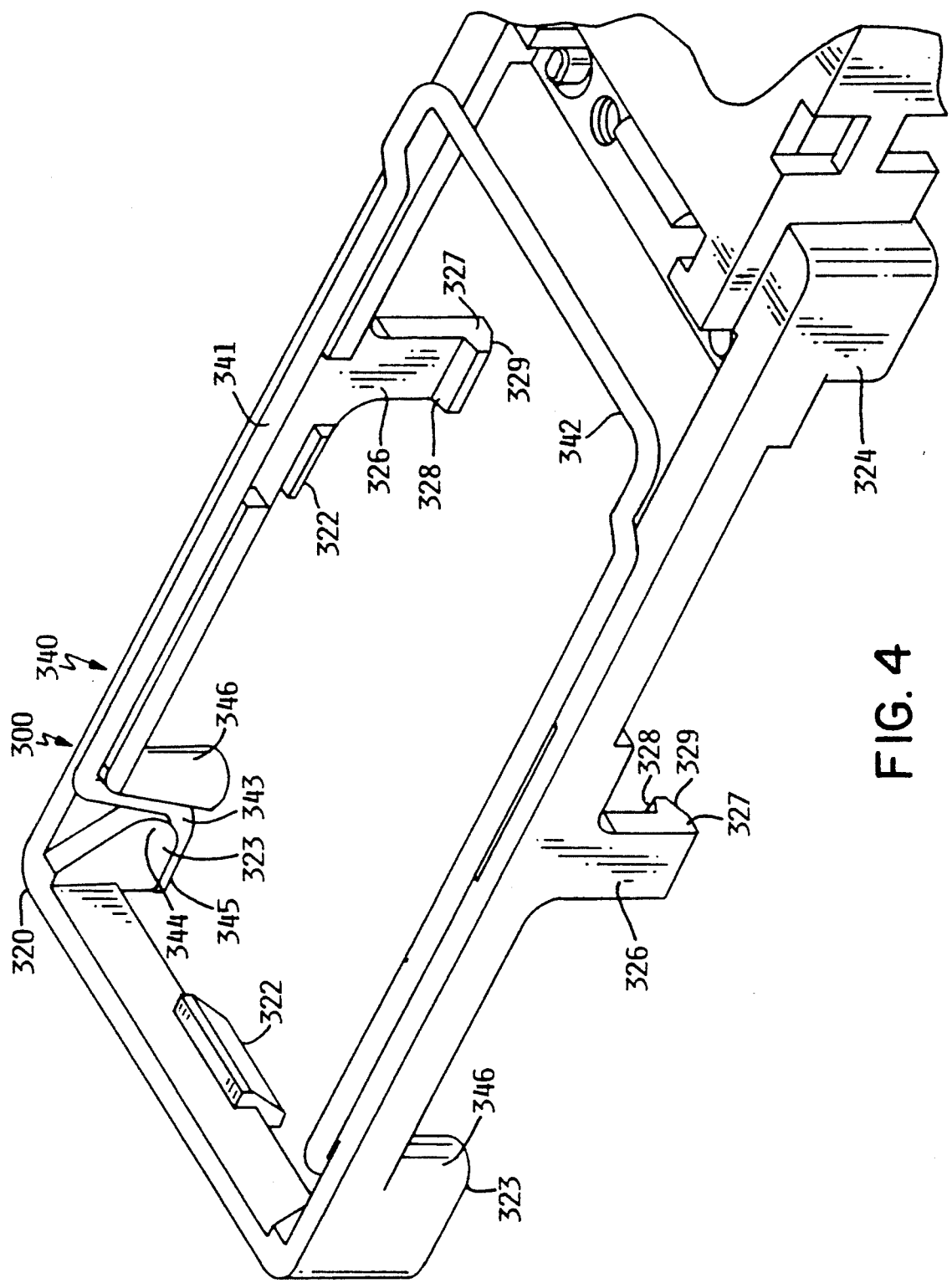
FIG. 4 is a perspective view of a frame for another form of a subassembly according to the invention.

FIG. 4 shows a disengagement means 340 on a modified frame 320 of a subassembly 300. In this version, a wire bail 341 lies atop the frame, and rear feet 323 are somewhat shortened. Pulling upward on handle 342 causes elbow 343 to rotate about a rounded fulcrum 344 formed in foot 323, thereby pushing arm 345 downward. When the subassembly is mounted on a base card, arm 345 pushes against the base card, pulling hooks 326 out of their slots, and also applies a large disengagement pressure to separate the mated connectors. The subassembly may then be removed easily. A forward portion 346 of foot 323 and the surface of card 310 cooperate to trap bail 341 so that it cannot fall out of frame 320 when the subassembly is removed.

Other modifications within the scope of the invention will be apparent to those skilled in the art.

Having described a preferred embodiment thereof, we claim as our invention:

1. An electronics assembly, comprising:
   a base card positioned in a base plane and having at least one row of elongated slots each having an axis in a first direction, said slots being spaced across said base card in a second direction, and having a plurality of electrical base-card connectors mounted thereon;
   a plurality of smaller subassemblies removably mounted on said base card, each said unit subassembly being positioned in a plane parallel to said base card, and having
   a circuit card carrying a plurality of electronic circuits,
   a connector for mating with one of said base-card connectors,
   a pair of substantially straight side edges extending in a direction transverse to said second direction,
   at least two spaced-apart feet projecting from said subassembly and resting on said base,
   at least two spaced-apart hooks projecting from respective ones of said side edges of said subassembly, each of said hooks engaging a different one of said slots so as to cause said feet to exert pressure upon said base card, and each of said, hooks being located at a different position along its respective side edge, so that each of said hooks engages its respective slot at a location along said respective slot such that adjacent hooks of two different ones of said subassemblies engage the same slot at different locations along the axis of said same slot.

2. An assembly according to claim 1, wherein said base card has upper and lower sides, each having a plurality of said electrical base-card connectors, and wherein said plurality of subassemblies are mounted on both sides of said base card in said one row of said slots.

3. An assembly according to claim 1, wherein each of said subassemblies further includes socket means for external connections in said plane of said base card.

4. An assembly according to claim 3, wherein each of said subassemblies further includes an optical source and optical detector, mounted in said socket means.

5. An electronics subassembly for mounting on a base card positioned in a base plane and having at least one row of elongated slots each having an axis in a first direction, said slots being spaced across said base card in a second direction, and having a plurality of electrical base-card connectors mounted thereon, said subassembly comprising:

a circuit card positioned in a plane parallel to said base plane, a connector for mating with one of said base-card connectors, a pair of substantially straight side edges extending in a direction transverse to said second direction, at least two spaced-apart feet projecting from said subassembly and having a length sufficient to rest on said base, at least two spaced-apart hooks projecting from respective ones of said side edges of said subassembly, each of said hooks having a shape for engaging a different one of said slots so as to cause said feet to exert pressure upon said base card, and each of said hooks being located at a different position along its respective side edge, so that each of said hooks engages its respective slot at a location along said respective slot such that adjacent hooks of two different ones of said subassemblies engage the same slot at different locations along the axis of said same slot.

6. A subassembly according to claim 5, wherein said subassembly includes a circuit card and frame means at least partially surrounding said card in the plane of said card.

7. A subassembly according to claim 5, wherein said base card includes a row of locating means, and wherein said feet have corresponding subassembly locating means fitting into said locating means on said base card.

8. A subassembly according to claim 5, wherein said subassembly has four corners, and has one of said feet at each of said corners.

9. A subassembly according to claim 5, wherein said hooks are bevelled sufficiently for releasing said subassembly from said base card by upward pressure on said subassembly.

10. A subassembly according to claim 5, wherein said subassembly further includes a bail for camming said subassembly away from said base.

11. A subassembly according to claim 5, wherein said subassembly further includes socket means at one end thereof, for connecting cables parallel to said circuit-card plane.

12. A subassembly according to claim 11, wherein said socket means accepts optical cables.

* * * * *